(12) United States Patent
Horie (10) Patent No.: US 11,490,072 B2
(45) Date of Patent: Nov. 1, 2022

(54) IMAGE SENSOR SYSTEM AND IMAGE SENSOR

(71) Applicant: OMRON Corporation, Kyoto (JP)

(72) Inventor: Masaru Horie, Kusatsu (JP)

(73) Assignee: OMRON Corporation, Kyoto (JP)

( * ) Notice: Subject to any disclaimer, the term of this patent is extended or adjusted under 35 U.S.C. 154(b) by 157 days.

(21) Appl. No.: 16/190,160

(22) Filed: Nov. 14, 2018

(65) Prior Publication Data

US 2019/0268995 A1 Aug. 29, 2019

(30) Foreign Application Priority Data

Feb. 23, 2018 (JP) .............................. JP2018-031113

(51) Int. Cl.
*G01R 31/44* (2020.01)
*H04N 17/00* (2006.01)
(Continued)

(52) U.S. Cl.
CPC ....... *H04N 17/002* (2013.01); *G01R 31/2635* (2013.01); *G01R 31/44* (2013.01);
(Continued)

(58) Field of Classification Search
CPC ........ H05B 45/58; H05B 45/50; H05B 47/20; H05B 47/125; H04N 17/002;
(Continued)

(56) References Cited

U.S. PATENT DOCUMENTS

| 9,807,839 B1 | 10/2017 | Gordin et al. |
| 2003/0015973 A1* | 1/2003 | Ovens ................... H05B 45/58 |
| | | 315/291 |

(Continued)

FOREIGN PATENT DOCUMENTS

| CN | 103535113 | 1/2014 |
| JP | 2000066117 | 3/2000 |

(Continued)

OTHER PUBLICATIONS

"Degradation of (InAlGa)N-based UV-B light emitting diodes stressed by current and temperature". Glaab et al. Published in Journal of Applied Physics 2015 (Year: 2015).*

(Continued)

*Primary Examiner* — Jeff W Natalini
(74) *Attorney, Agent, or Firm* — JCIPRNET (57) ABSTRACT

An image sensor system includes an image sensor and a prediction part. The image sensor includes an illumination module and a processing part. The illumination module includes a light emitting part for emitting light and a nonvolatile memory. The processing part stores a first data and a second data in the memory. The first data includes an electric parameter value when the light emitting part is applied with a power and a cumulative power-on time obtained by accumulating a time when the light emitting part is applied with the power. The second data includes a value obtained by multiplying the electric parameter value when the light emitting part is applied with the power by the cumulative power-on time. The prediction part obtains the first data or the second data from the memory and predicts a lifetime of the light emitting part based on the first data or the second data.

9 Claims, 2 Drawing Sheets

(51) Int. Cl.
*G01R 31/26* (2020.01)
*H04N 5/225* (2006.01)
*G03B 15/05* (2021.01)
*H05B 45/58* (2020.01)

(52) U.S. Cl.
CPC .......... *G03B 15/05* (2013.01); *H04N 5/2256* (2013.01); *H05B 45/58* (2020.01)

(58) Field of Classification Search
CPC .... H04N 5/2256; H04N 5/2253; G03B 15/05; G03B 2206/00; G01R 31/2635; G01R 31/44; G01M 11/00
See application file for complete search history.

(56) References Cited

U.S. PATENT DOCUMENTS

| | | | |
|---|---|---|---|
| 2008/0284767 A1 | 11/2008 | Mori et al. | |
| 2010/0244691 A1* | 9/2010 | Ferru | H05B 45/40 315/32 |
| 2011/0254554 A1* | 10/2011 | Harbers | G01K 11/00 324/414 |
| 2014/0072013 A1* | 3/2014 | Ruknudeen | H05B 45/12 374/178 |
| 2014/0074434 A1* | 3/2014 | De Lima | G01R 31/44 702/183 |
| 2015/0032388 A1 | 1/2015 | Nakagawa | |
| 2016/0109507 A1* | 4/2016 | Hamon | G01R 31/2635 324/414 |
| 2016/0192457 A1* | 6/2016 | Chen | H05B 47/20 315/136 |
| 2018/0302972 A1* | 10/2018 | Flinsenberg | H05B 47/20 |

FOREIGN PATENT DOCUMENTS

| | | |
|---|---|---|
| JP | 2003180632 | 7/2003 |
| JP | 2005257531 | 9/2005 |
| JP | 2006013171 | 1/2006 |
| JP | 2007214682 | 8/2007 |
| JP | 2015018618 | 1/2015 |
| JP | 2017083554 | 5/2017 |
| WO | 2016002069 | 1/2016 |

OTHER PUBLICATIONS

"Search Report of Europe Counterpart Application", dated May 31, 2019, p. 1-p. 7.
"Office Action of Japan Counterpart Application", dated Nov. 17, 2020, with English translation thereof, p. 1-p. 8.
"Office Action of China Counterpart Application", dated Aug. 10, 2020, with English translation thereof, pp. 1-17.
"Office Action of Japan Counterpart Application" with English translation thereof, dated Jul. 6, 2021, p. 1-p. 10.

* cited by examiner

IMAGE SENSOR SYSTEM AND IMAGE SENSOR

CROSS-REFERENCE TO RELATED APPLICATION

This application claims the priority benefit of Japan application serial no. 2018-031113, filed on Feb. 23, 2018. The entirety of the above-mentioned patent application is hereby incorporated by reference herein and made a part of this specification.

BACKGROUND

Technical Field

The disclosure relates to an image sensor system and an image sensor used in a production line of a factory.

Description of Related Art

In the production line of a factory, a system called image sensor is frequently used for automating inspection and management of products and saving labors. In the past, a configuration that connects a camera and an image processing device with a cable is commonly used for the system (see Patent Document 1). However, recently, a processing-integrated image sensor has also been launched and the image sensor integrates the camera and the image processing device together so as to capture images and process the captured images with a single device. Such a processing-integrated image sensor is also called a "smart camera," which may also be integrated with an integrating illumination device and lenses.

In order to carry out stable inspection with the image sensor, it is desirable to optimize the model (type), specification and performance of the illuminations, lenses, and imaging elements according to an imaging environment, an object to be inspected, the purposes of the inspection, etc. Therefore, manufactures who provide smart cameras have lined up a large number of products such as illuminations, lenses, imaging elements, etc., with the different models (types), specifications and performances changed little by little, for the user to select the one with the optimum specification.

However, as the IoT development of factories is accelerating, the range of application of smart cameras has been expanded, and it is becoming difficult to provide product variations that cover the diverse user needs. Further, in order to be distinguished from the competitors in product competition, more mass customization and seasonal products are offered to meet the preference of each customer and the life cycle of the products of digital devices typified by smart phones is shortening, and there is an increasing need for partially changing the illuminations and lenses, etc. to be optimized for the inspection as the change of the object to be inspected enters a short cycle. Thus, in the recent years, the so-called a modular structure smart camera has been introduced, which respectively modularizes the illumination elements, lenses, and image capturing elements, and, from the user side, the user may freely combine the illumination elements, lenses, and image capturing elements as desired. Such a smart camera includes an illumination module, a lens module, an imaging element module, etc. The illumination module has a light emitting element such as an LED (Light Emitting Diode) and illuminates an object such as a product with use of the light emission of the light emitting element.

The light quantity of the illumination module deteriorates with the number of years of use. Therefore, if the illumination module is continued to be used, the brightness of the illumination module may change even if the illumination module is used with the same setting value as that at the start of use.

In the smart camera, it is possible to monitor the deterioration of the whole system including the illumination module, the lens module, the imaging element module, etc., but it is not possible to monitor the deterioration of each module individually. In addition, although it is conceivable to monitor the light quantity of the illumination module with use of a PD (Photodiode), since it is necessary to install the PD on the substrate of the illumination module, problems such as cost increase and expansion of the substrate area occur.

Related Art is Japanese Laid-open No. 2007-214682.

SUMMARY

A first aspect of the disclosure provides an image sensor system including an image sensor and a prediction part. The image sensor includes an illumination module and a processing part. The illumination module includes a light emitting part for emitting light and a nonvolatile memory. The processing part stores a first data and a second data in the memory. The first data includes an electric parameter value when the light emitting part is applied with a power and a cumulative power-on time obtained by accumulating a time when the light emitting part is applied with the power. The second data includes a value obtained by multiplying the electric parameter value when the light emitting part is applied with the power by the cumulative power-on time. The prediction part obtains the first data or the second data from the memory and predicts a lifetime of the light emitting part based on the first data or the second data.

A second aspect of the disclosure provides an image sensor including an illumination module, a control part and a prediction part. The illumination module includes a light emitting part for emitting light and a nonvolatile memory. The control part stores a first data and a second data in the memory. The first data includes an electric parameter value when the light emitting part is supplied with a power and a cumulative power-on time obtained by accumulating a time when the light emitting part is supplied with the power. The second data includes a value obtained by multiplying the electric parameter value when the light emitting part is supplied with the power by the cumulative power-on time. The prediction part obtains the first data or the second data from the memory and predicts a lifetime of the light emitting part based on the first data or the second data.

DESCRIPTION OF THE EMBODIMENTS

An embodiment of the disclosure provides a technique for monitoring deterioration of an illumination module.

In the disclosure, in order to solve the above problems, the following means are adopted. A first aspect of exemplary embodiments of the disclosure provides an image sensor system including an image sensor and a prediction part. The image sensor includes an illumination module and a processing part. The illumination module includes a light emitting part for emitting light and a nonvolatile memory. The processing part stores a first data and a second data in the memory. The first data includes an electric parameter value when the light emitting part is applied with a power and a cumulative power-on time obtained by accumulating a time when the light emitting part is applied with the power. The second data includes a value obtained by multiplying the electric parameter value when the light emitting part is applied with the power by the cumulative power-on time. The prediction part obtains the first data or the second data from the memory and predicts a lifetime of the light emitting part based on the first data or the second data.

According to this configuration, the electric parameter value when the light emitting part is applied with the power and the cumulative power-on time by accumulating the time when the light emitting part is applied with the power can be obtained from the nonvolatile memory of the illumination module and the lifetime of the light emitting part can be predicted based on the electric parameter value and the cumulative power-on time.

According to this configuration, the value obtained by multiplying the electric parameter value when the light emitting part is applied with the power by the cumulative power-on time can be obtained from the nonvolatile memory of the illumination module, the lifetime of the light emitting part can be predicted based on the value obtained by multiplying the electric parameter value when the light emitting part is applied with the power by the cumulative power-on time. In this way, the user can recognize the lifetime of the light emitting part and consider the inspection and replacement time of the illumination module based on the prediction result of the lifetime of the light emitting part. Since the user can consider the inspection and replacement time of the illumination module, the user can perform preventive maintenance to prevent beforehand occurrence of a malfunction of the illumination module. Accordingly, the image sensor system capable of monitoring the deterioration of the illumination module is provided.

In the image sensor system, the light emitting part is operable with a plurality of current values, and the processing part may store a third data and a fourth data in the memory. The third data includes a plurality of electric parameter values when the light emitting part is applied with the power and the cumulative power-on time for each of the plurality of electric parameter values. The fourth data includes values obtained by respectively multiplying the plurality of electric parameter values when the light emitting part is applied with the power by the cumulative power-on time for each of the plurality of electric parameter values. The prediction part may obtain the third data or the fourth data from the memory and predict the lifetime of the light emitting part based on the third data or the fourth data.

According to this configuration, the prediction part can predict the lifetime of the light emitting part based on the plurality of electric parameter values when the light emitting part is applied with the power and the cumulative power-on time for each of the plurality of electric parameter values.

According to this configuration, the prediction part can predict the lifetime of the light emitting part based on the values obtained by respectively multiplying the plurality of electric parameter values when the light emitting part is applied with the power by the cumulative power-on time for each of the plurality of electric parameter values. In this way, the prediction accuracy of the lifetime of the light emitting part is improved, and the user can recognize the lifetime of the light emitting part more accurately.

In the image sensor system, the processing part may store a fifth data and a sixth data in the memory. The fifth data includes the electric parameter value greater than or equal to a first threshold value and the cumulative power-on time for the electric parameter value greater than or equal to the first threshold value. The sixth data includes a value obtained by multiplying the electric parameter value greater than or equal to a second threshold value by the cumulative power-on time for the electric parameter value greater than or equal to a second threshold value. The prediction part may obtain the fifth data or the sixth data from the memory and predict the lifetime of the light emitting part based on the fifth data or the sixth data.

According to this configuration, the electric parameter value greater than or equal to the first threshold value and the cumulative power-on time for the electric parameter value greater than or equal to the first threshold value are stored in the memory. According to this configuration, the value obtained by multiplying the electric parameter value greater than or equal to the second threshold value by the cumulative power-on time for the electric parameter value greater than or equal to the second threshold value is stored in the memory. In this way, the number of times of writing to the memory can be reduced, and the period before reaching the limit of the number of times of writing to the memory can be extended.

In the image sensor system, the processing part may store the first data or the second data in the memory at a predetermined time interval. In the image sensor system, the processing part may store the third data or the fourth data in the memory at a predetermined time interval. In the image sensor system, the processing part may store the fifth data or the sixth data in the memory at a predetermined time interval. According to this configuration, since the data is stored in the memory at a predetermined time interval, the number of times of writing to the memory can be reduced, and the period before reaching the limit of the number of times of writing to the memory can be extended.

A second aspect of exemplary embodiments of the disclosure provides an image sensor including an illumination module, a control part and a prediction part. The illumination module includes a light emitting part for emitting light and a nonvolatile memory. The control part stores a first data and a second data in the memory. The first data includes an electric parameter value when the light emitting part is supplied with a power and a cumulative power-on time obtained by accumulating a time when the light emitting part is supplied with the power. The second data includes a value obtained by multiplying the electric parameter value when the light emitting part is supplied with the power by the cumulative power-on time. The prediction part obtains the first data or the second data from the memory and predicts a lifetime of the light emitting part based on the first data or the second data.

According to this configuration, the electric parameter value when the light emitting part is applied with the power and the cumulative power-on time by accumulating the time when the light emitting part is applied with the power can be obtained from the nonvolatile memory of the illumination module and the lifetime of the light emitting part can be predicted based on the electric parameter value and the cumulative power-on time. According to this configuration, the value obtained by multiplying the electric parameter value when the light emitting part is applied with the power by the cumulative power-on time can be obtained from the nonvolatile memory of the illumination module, and the lifetime of the light emitting part can be predicted based on the value obtained by multiplying the electric parameter value when the light emitting part is applied with the power by the cumulative power-on time. In this way, the user can recognize the lifetime of the light emitting part and consider the inspection and replacement time of the illumination module based on the prediction result of the lifetime of the light emitting part. Accordingly, the image sensor capable of monitoring the deterioration of the illumination module is provided.

Effects

According to the disclosure, a technique for monitoring the deterioration of the illumination module with use of a memory included in the illumination module can be provided.

Applicable Example

Figure 1:
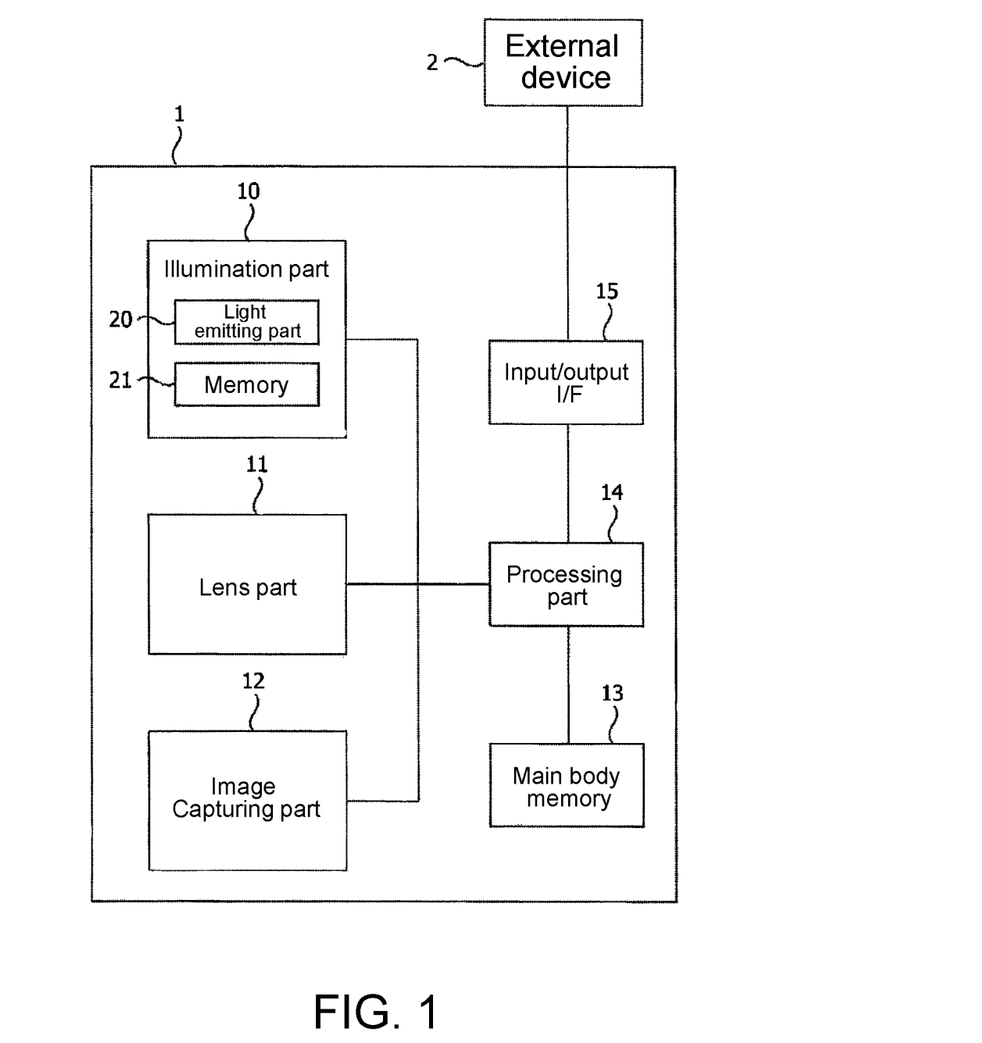
FIG. 1 is a block diagram schematically showing the configuration of an image sensor system.

First, an example of the scene to which the disclosure is applied will be described. FIG. 1 is a block diagram schematically showing a configuration of an image sensor system. The image sensor system includes an image sensor 1 and an external device 2. The image sensor 1 includes an illumination part 10, a lens part 11 and an imaging part 12 as an imaging system. The illumination part 10 has a light emitting part 20 and a nonvolatile memory 21. The light emitting part 20 has at least one light emitting element that emits light upon receiving a power from a power supply (not shown). The light emitting element is, for example, an LED. The illumination part 10 is a device for illuminating a subject (an object to be inspected, etc.) within a field of view of the image sensor 1 with use of the light emitted from the light emitting part 20. Further, the image sensor 1 includes a main body memory 13, a processing part 14 and an input/output I/F 15 as a processing system. The processing part 14 is an example of a control part. The processing part 14 controls an imaging system and performs data transmission/reception and the like with an external device 2 via the input/output I/F 15. The processing part 14 stores a first data in the main body memory 13. The first data includes an electric parameter value when the light emitting part 20 is applied with the power and a cumulative power-on time by accumulating the time when the light emitting part 20 is applied with the power. The electric parameter value includes at least one of a current value, a voltage value, a VF (forward voltage) value, and a resistance value. The processing part 14 stores a second in the main body memory 13. The second data includes a value obtained by multiplying the electric parameter value when the light emitting part 20 is applied with the power by the cumulative power-on time. The processing part 14 stores the first data or the second data in the memory 21 at any timing or at a predetermined time interval. The processing part 14 obtains the first data or the second data from the memory 21 at any timing. The processing part 14 may obtain the first data or the second data from the memory 21 according to a request from the external device 2.

The processing part 14 transmits the first data or the second data obtained from the memory 21 to the external device 2 at any timing. The external device 2 receives the first data or the second data and predicts the lifetime of the light emitting part 20 based on the received first data or the received second data. Further, the processing part 14 may predict the lifetime of the light emitting part 20 based on the first data or the second data obtained from the memory 21. The prediction result of the lifetime of the light emitting part 20 is displayed on a display device of the external device 2. Therefore, the electric parameter value and the cumulative power-on time are stored in the memory 21 of the illumination part 10, and the lifetime of the light emitting part 20 is predicted based on the electric parameter value and the cumulative power-on time, and in this way, a user can consider the inspection and replacement time of the illumination part 10. Further, the value obtained by multiplying the electric parameter value by the cumulative power-on time is stored in the memory 21 of the illumination part 10, and the lifetime of the light emitting part 20 is predicted based on the value obtained by multiplying the electric parameter value by the cumulative power-on time, and in this way, the user can consider the inspection and replacement time of the illumination part 10. In this way, it is possible to monitor the deterioration of the illumination module (the illumination part 10) which is one of a plurality of modules included in the image sensor 1.

First Embodiment

<Configuration of the Image Sensor>

Figure 2A:
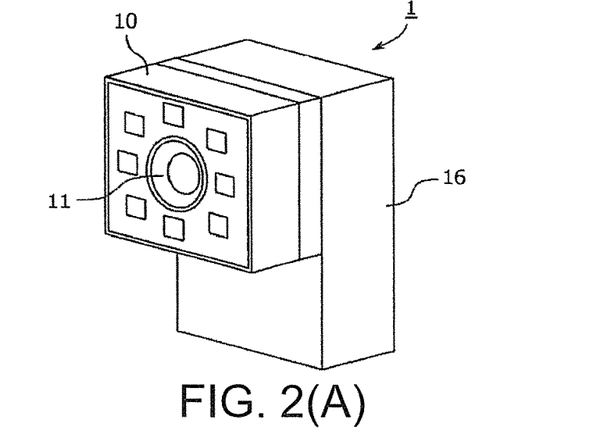
FIG. 2(A) is a perspective view schematically showing the appearance of an image sensor.
Figure 2B:
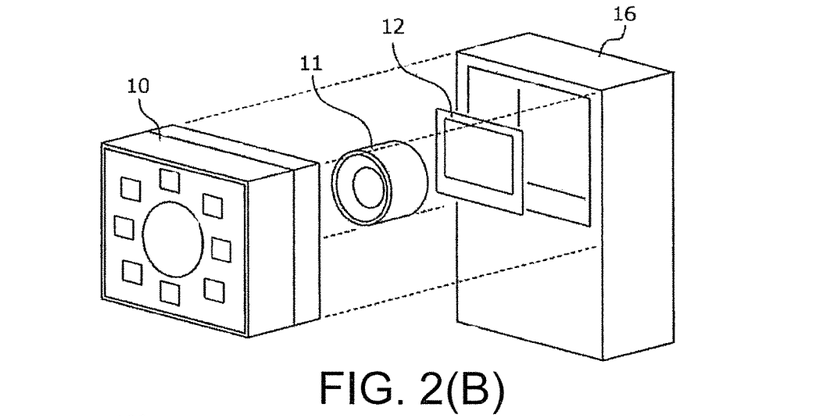
FIG. 2(B) is a perspective view schematically showing a state where the image sensor is disassembled.

The image sensor system according to the first embodiment of the disclosure will be described with reference to FIG. 1, FIG. 2(A) and FIG. 2(B). FIG. 1 is a block diagram schematically showing the configuration of the image sensor system. FIG. 2(A) is a perspective view schematically showing the appearance of the image sensor, and FIG. 2(B) is a perspective view schematically showing a state where the image sensor is disassembled.

The image sensor 1 is a device installed in a production line of a factory, for example, and used for various processes using images. The image sensor 1 is also called a vision sensor or a vision system. The image sensor 1 of the first embodiment is a processing-integrated image sensor (the so-called smart camera) integrally formed by integrating an imaging system and a processing system.

The image sensor 1 includes the illumination part 10, the lens part 11, and the imaging part 12 as the imaging system. The illumination part 10 is a device for illuminating a subject (an object to be inspected, etc.) within a field of view of the image sensor 1 and is composed of a plurality of light emitting elements (LEDs, etc.) arranged around the lens part 11, for example. The lens part 11 is an optical system for forming an optical image of the subject on the imaging part 12. For example, an optical system having functions such as focus adjustment, aperture, zoom, etc. is used. The imaging part 12 is a device for generating and outputting image data through photoelectric conversion and is composed of imaging elements such as CCD and CMOS, for example.

The image sensor 1 includes the main body memory 13, the processing part 14 and the input/output I/F 15 as the processing system. The processing part 14 is a device for performing image processing (for example, preprocessing, feature amount extraction, etc.) on the image data taken from the imaging system, various processes based on the result of the image processing (for example, inspection, character recognition, individual identification, etc.), data transmission/reception with the external device 2 via the input/output I/F 15, generation of data to be outputted to the external device 2, processing of data received from the external device 2, control of the imaging system and the input/output I/F 15, etc. The processing part 14 stores current values when the light emitting part 20 is applied with the power and the cumulative power-on time in the main body memory 13 and the memory 21. In the following, an example in which the processing part 14 stores the current values (an example of the electric parameter value) in the main body memory 13 and the memory 21 will be described, but the disclosure is not limited to this example, and the processing part 14 may store a voltage value, a VF value, and a resistance value in the main body memory 13 and the memory 21. The current values when the light emitting part 20 is applied with the power (hereinafter simply referred to as "the current values") and the cumulative power-on time are temporarily stored in the main body memory 13. The main body memory 13 may be a volatile memory or a nonvolatile memory. The main body memory 13 may have any data capacity.

The processing part 14 is composed of a processor and a memory, for example, and the processor reads and executes programs stored in the memory so as to realize the various processes described above. A part or all of the functions of the processing part 14 may be realized by an ASIC, an FPGA, etc. or may be provided by an external device. The input/output I/F 15 is a communication interface for transmitting/receiving data to/from the external device 2. For example, the input/output I/F 15 includes a network interface for connecting to a PLC (Programmable Logic Controller, PLC) or a management terminal (computer), a parallel interface for connecting to another sensor or controller, etc.

The image sensor 1 of the first embodiment has a modular structure in which, as shown in FIG. 2(B), the three modules, i.e., the illumination part 10, the lens part 11, and the imaging part 12, are selected and attached to a sensor body 16. Each of the modules is fixed to the sensor body 16 by screw fastening, for example, and the user can attach/detach the module freely.

Multiple types of modules are prepared to serve as the illumination part (illumination module) 10, such as modules with illumination lights of different wavelengths like white illumination/red illumination/infrared light illumination, and modules with different light emitting element arrangements, light quantities, or light emitting patterns. Further, multiple types of light sources (LEDs, etc.) such as red, blue, green, and infrared light sources are provided in one module, and an illumination module that is capable of irradiating lights of wavelengths (for example, white, violet, pink, etc.) other than red, blue, green, and infrared through control of light emission of each light source may also be used. This type of illumination is called multi-color illumination, etc. Multiple types of modules are prepared to serve as the lens part (lens module) 11, such as a module having a function of adjusting the focus manually or automatically with use of an actuator, etc., a module with different fields of view such as a narrow field of view/a wide field of view, and a module having a zoom function. Multiple types of modules are prepared to serve as the imaging part (imaging module) 12, such as modules having different numbers of pixels, frame rates, and shutter types (rolling shutter/global shutter). The user can combine proper modules as appropriate according to the purpose or the required specification of the image sensor 1.

Figure 3:
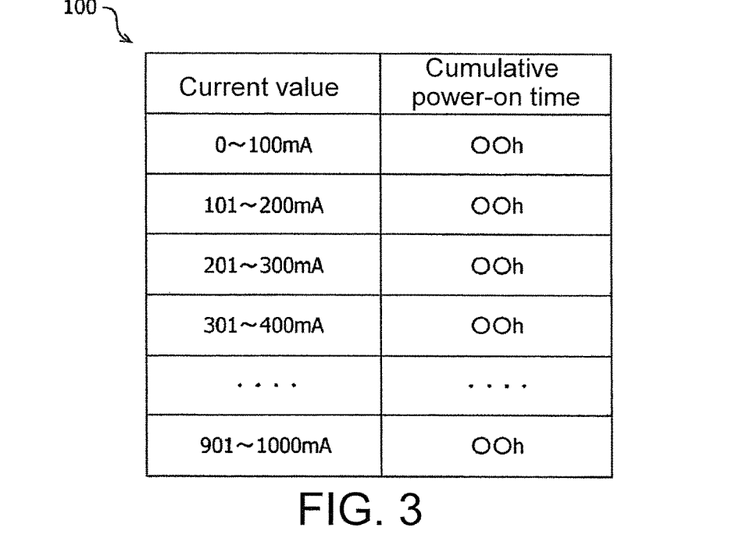
FIG. 3 is a diagram showing an example of a table stored in a main body memory.

The illumination part 10 has the light emitting part 20 for emitting light. The light emitting part 20 has at least one light emitting element that emits light upon receiving power supply from the power supply (not shown). The light emitting element is, for example, an LED. The current values applied to the light emitting part 20 are variable, and the light emitting part 20 is operable with a plurality of current values. The brightness of the illumination part 10 varies according to the current values flowing through the light emitting part 20. Power supply control (current value switching, power on/off, etc.) for the light emitting part 20 is performed by the processing part 14. The processing part 14 stores the cumulative power-on time for each current value applied to the light emitting part 20 in the main body memory 13. That is, the processing part 14 stores in the main body memory 13 the current values before change, the current values after change, the cumulative power-on time for the current values before change and the cumulative power-on time for the current values after change. For example, the processing part 14 may store in the main body memory 13 a table 100 as shown in FIG. 3. FIG. 3 is a diagram showing an example of the table 100 stored in the main body memory 13. The plurality of current values is stored in the left field of the table 100. As shown in FIG. 3, each of the plurality of current values may be a value within a certain range. Further, each of the plurality of current values may be a certain value. The cumulative power-on time for each of the plurality of current values is stored in the right field of the table 100. For example, the cumulative power-on time at factory shipment is set to 0h, and the plurality of current values and the cumulative power-on time for each of the plurality of current values are counted up after power is supplied to the illumination part 10.

The processing part 14 stores the data including the plurality of current values and the cumulative power-on time for each of the plurality of current values (hereinafter simply referred to as "the plurality periods of cumulative power-on time") in the memory 21. In this case, the processing part 14 writes the data temporarily stored in the main body memory 13 to the memory 21. For example, when the table 100 of FIG. 3 is stored in the main body memory 13, the processing part 14 writes the table 100 of FIG. 3 to the memory 21. The processing part 14 may erase the data of the main body memory 13 when the writing to the memory 21 is completed. For example, EPROM (Electrically Programmable Read Only Memory, EPROM), EEPROM (Electrically Erasable Programmable Read Only Memory, EEPROM), FeRAM (Ferroelectric Random Access Memory, FeRAM), MRAM (Magnetoresistive Random-Access Memory, MRAM), etc. can be used as the memory 21, and the memory 21 may have any data capacity.

The processing part 14 may store the plurality of current values and the plurality periods of cumulative power-on time in the memory 21 at a predetermined time interval. Specifically, the processing part 14 may store the plurality of current values per unit time and the plurality periods of cumulative power-on time per unit time in the memory 21 at a predetermined time interval. For example, the processing part 14 may store the plurality of current values per hour and the plurality periods of cumulative power-on time per hour in the memory 21 hourly. Since the memory 21 has a limit of the number of times of writing (lifetime), by storing the data in the memory 21 at a predetermined time interval, the number of times of writing to the memory 21 can be reduced. In this way, the period before reaching the limit of the number of times of writing to the memory 21 can be extended. For example, the limit of the number of times of writing to the EEPROM is about 100,000 times. When data is stored in the EEPROM hourly, the time before reaching the limit of the number of times of writing to the EEPROM is about seven years. Further, the processing part 14 may store the plurality of current values and the plurality periods of cumulative power-on time in the memory 21 at any timing.

The processing part 14 may store the current values greater than or equal to a threshold value and the cumulative power-on time for the current values greater than or equal to the threshold value in the memory 21. Depending on the value of the current values flowing through the light emitting part 20, the current values in some cases do not affect the deterioration of the light emitting part 20. By not storing in the memory 21 the current values that do not affect the deterioration of the light emitting part 20 and the cumulative power-on time of the current values that do not affect the deterioration of the light emitting part 20, the number of times of writing to the memory 21 can be reduced. Further, the amount of data written in the memory 21 can be reduced. When the plurality of current values and the plurality periods of cumulative power-on time are stored in the main body memory 13, the processing part 14 may extract from the main body memory 13 the current values greater than or equal to the threshold value from the plurality of current values and the cumulative power-on time for the current values greater than or equal to the threshold value and store the extracted data in the memory 21. The processing part 14 may store in the memory 21 the average value of the plurality of current values applied to the light emitting part 20 and the total value of the cumulative power-on time for each of the plurality of current values. In this way, the amount of data written in the memory 21 can be reduced.

The processing part 14 obtains the data stored in the memory 21 from the memory 21 at any timing. For example, the processing part 14 obtains the data including the plurality of current values and the plurality periods of cumulative power-on time from the memory 21 at any timing. The processing part 14 may obtain the data stored in the memory 21 from the memory 21 according to a request from the external device 2. For example, the processing part 14 may obtain the data including the plurality of current values and the plurality periods of cumulative power-on time from the memory 21 according to a request from the external device 2. The user can operate the external device 2 at a desired timing to retrieve the data including the plurality of current values and the plurality periods of cumulative power-on time from the memory 21. The processing part 14 transmits the data obtained from the memory 21 to the external device 2. For example, the processing part 14 transmits the data including the plurality of current values and the plurality periods of cumulative power-on time to the external device 2. Further, the processing part 14 may transmit the data stored in the main body memory 13 to the external device 2 according to a request from the external device 2.

The external device 2 includes a processing device such as a personal computer (PC), an external storage device such as a database (DB), a communication interface, a display device, etc. The processing device is composed of a processor such as a CPU (Central Processing Unit), a memory, etc. The external device 2 receives the data stored in the memory 21 from the image sensor 1. For example, the external device 2 receives the data including the plurality of current values and the plurality periods of cumulative power-on time from the image sensor 1. The processing device of the external device 2 predicts the lifetime of the light emitting part 20 based on the data stored in the memory 21. For example, the processing device of the external device 2 predicts the lifetime of the light emitting part 20 based on the data including the plurality of current values and the plurality periods of cumulative power-on time. The processing device of the external device 2 may predict the lifetime of the light emitting part 20 by calculating the lifetime of the light emitting part 20 with use of a known lifetime calculation formula. The processing device of the external device 2 is an example of a prediction part. The processing device of the external device 2 may obtain other data used for predicting the lifetime of the light emitting part 20 from the database (DB). With the prediction result of the lifetime of the light emitting part 20 displayed on the display device of the external device 2, the user can recognize the lifetime of the light emitting part 20. Based on the prediction result of the lifetime of the light emitting part 20, the user can consider the inspection and replacement time of the illumination part 10. In this way, according to the first embodiment, the illumination part 10 can be monitored.

For example, after a certain period of time has elapsed since the start of the power supply to the illumination part 10, the illumination part 10 may be detached from the image sensor 1, and the detached illumination part 10 may be attached to another image sensor 1. The plurality of current values and the plurality periods of cumulative power-on time counted after the start of the power supply to the illumination part 10 are stored in the memory 21. Therefore, the external device 2 can obtain from the memory 21 the plurality of current values and the plurality periods of cumulative power-on time during the period from the start of the power supply to the illumination part 10 to the present. In this way, in the image sensor 1 of the first embodiment, even when the module is reassembled after the start of the power supply to the illumination part 10, the external device 2 can predict the lifetime of the light emitting part 20.

The processing device of the external device 2 may determine the state of the light emitting part 20 based on the data stored in the memory 21. For example, the processing device of the external device 2 may determine the state of the light emitting part 20 based on the data including the plurality of current values and the plurality periods of cumulative power-on time. The state of the light emitting part 20 includes, for example, decrease of light quantity from a predetermined state of the light emitting part 20. The processing device of the external device 2 may determine the state of the light emitting part 20 by calculating the light output of the light emitting part 20 with use of a known deterioration calculation formula. The processing device of the external device 2 may obtain other data used for determining the state of the light emitting part 20 from the database (DB). With the determination result of the state of the light emitting part 20 displayed on the display device of the external device 2, the user can recognize the state of the light emitting part 20. Based on the determination result of the state of the light emitting part 20, the user can consider the inspection and replacement time of the illumination part 10. In this way, according to the first embodiment, the illumination part 10 can be monitored.

The above shows an example in which the processing device of the external device 2 predicts the lifetime of the light emitting part 20 based on the current values and the cumulative power-on time. The disclosure is not limited to this example, and the processing device of the external device 2 may calculate the current values from voltage values, VF values and resistance values and predict the lifetime of the light emitting part 20 based on the current values and the cumulative power-on time. In other words, the processing device of the external device 2 predicts the lifetime of the light emitting part 20 based on the electric parameter value and the cumulative power-on time. The processing device of the external device 2 may predict the lifetime of the light emitting part 20 based on a plurality of electric parameter values and the plurality periods of cumulative power-on time. Further, the processing device of the external device 2 may determine the state of the light emitting part 20 based on the plurality of electric parameter values and the plurality periods of cumulative power-on time.

<Lifetime Prediction>

The prediction of the lifetime of the light emitting part 20 may be performed by the following method. The light output (P) of an LED decreases exponentially with respect to the cumulative power-on time (operation time) and is calculated by the following [Expression 1].

[Expression 1]

$$P = P_0 \times \exp(-\beta t) \qquad \text{[Expression 1]}$$

$P_0$: initial light output of LED
$\beta$: degradation rate
t: cumulative power-on time (operation time)

The deterioration rate ($\beta$) of [Expression 1] varies with the material, structure, use conditions, etc. of the element and is calculated by the following [Expression 2].

[Expression 2]

$$\beta = \beta_0 \times IF \times \exp(-Ea/kTj) \qquad \text{[Expression 2]}$$

$\beta_0$: degradation constant
IF: current value (operation current) [A]
Ea: activation energy [eV]
k: Boltzmann constant ($8.62 \times 10^{-5}$) [ev/K]
Tj: temperature of light emitting layer [K]

The degradation constant ($\beta_0$) depends on the LED, and the activation energy (Ea) depends on the material of the LED. The temperature of the light emitting layer (Tj) can be calculated from the thermal resistance, power consumption, and ambient temperature depending on the LED.

The processing device of the external device 2 calculates the light output (P) of the light emitting part 20 based on the current value and the cumulative power-on time with use of [Expression 1] and [Expression 2]. The processing device of the external device 2 may calculate the light output (P) of the light emitting part 20 based on the plurality of current values and the plurality periods of cumulative power-on time with use of [Expression 1] and [Expression 2]. The processing device of the external device 2 determines that the light emitting part 20 has reached the end of its lifetime when the light output (P) of the light emitting part 20 is less than or equal to a reference value. The processing device of the external device 2 determines that the state of the light emitting part 20 is bad when the light emitting part 20 has reached the end of its lifetime. The processing device of the external device 2 determines that the light emitting part 20 has not reached the end of its lifetime when the light output (P) of the light emitting part 20 is greater than the reference value. The processing device of the external device 2 determines that the state of the light emitting part 20 is good when the light emitting part 20 has not reached the end of its lifetime. The processing device of the external device 2 calculates the cumulative power-on time (t) when the light output (P) of the light emitting part 20 becomes less than or equal to the reference value with use of [Expression 1]. The processing device of the external device 2 may set the calculated cumulative power-on time (t) as the lifetime of the light emitting part 20.

Modified Example

The above is an example in which the processing device of the external device 2 predicts the lifetime of the light emitting part 20 based on the data including the plurality of current values and the plurality periods of cumulative power-on time obtained from the memory 21, but the disclosure is not limited to this example. For example, the processing part 14 may predict the lifetime of the light emitting part 20 based on the data including the plurality of current values and the plurality periods of cumulative power-on time obtained from the memory 21. In this case, the processing part 14 may receive other data used for predicting the lifetime of the light emitting part 20 from the external device 2. The processing part 14 is an example of the prediction part. The processing part 14 transmits the prediction result of the lifetime the light emitting part 20 to the external device 2. With the prediction result of the lifetime of the light emitting part 20 displayed on the display device of the external device 2, the user can recognize the lifetime of the light emitting part 20. Based on the prediction result of the lifetime of the light emitting part 20, the user can consider the inspection and replacement time of the illumination part 10. In this way, according to the modified example of the first embodiment, the illumination part 10 can be monitored. The processing part 14 may perform prediction of the lifetime of the light emitting part 20 with the above-described method of <Lifetime Prediction>.

Further, the processing part 14 may determine the state of the light emitting part 20 based on the data including the plurality of current values and the plurality periods of cumulative power-on time obtained from the memory 21. The state of the light emitting part 20 includes, for example, decrease of light quantity from a predetermined state of the light emitting part 20. In this case, the processing part 14 may receive other data used for determining the state of the light emitting part 20 from the external device 2. The processing part 14 transmits the determination result of the state the light emitting part 20 to the external device 2. With the determination result of the state of the light emitting part 20 displayed on the display device of the external device 2, the user can recognize the state of the light emitting part 20. Based on the determination result of the state of the light emitting part 20, the user can consider the inspection and replacement time of the illumination part 10. In this way, according to the modified example of the first embodiment, the illumination part 10 can be monitored.

Second Embodiment

The second embodiment will be described. In the second embodiment, the same components as those in the first embodiment are denoted by the same reference numerals as those in the first embodiment, and description thereof is omitted. In the second embodiment, the processing part 14 stores in the main body memory 13 the value obtained by multiplying the electric parameter value when the light emitting part 20 is applied with the power by the cumulative power-on time. The processing part 14 may store in the main body memory 13 a value obtained by multiplying the current value when the light emitting part 20 is applied with the power by the cumulative power-on time. The value obtained by multiplying the electric parameter value by the cumulative power-on time is temporarily stored in the main body memory 13. The processing part 14 stores the value obtained by multiplying the electric parameter value by the cumulative power-on time in the memory 21. Further, the processing part 14 stores the values obtained by respectively multiplying the plurality of electric parameter values by the cumulative power-on time for each of the plurality of electric parameter values in the memory 21. In this case, the processing part 14 writes the data temporarily stored in the main body memory 13 to the memory 21.

The processing part 14 may store the electric parameter value greater than or equal to the threshold value and the cumulative power-on time for the electric parameter value greater than or equal to the threshold value in the memory 21. The processing part 14 may store the value obtained by multiplying the electric parameter value when the light emitting part 20 is applied with the power by the cumulative power-on time in the memory 21 at a predetermined time interval. The processing part 14 may store the value obtained by multiplying the electric parameter value greater than or equal to the threshold value by the cumulative power-on time for the electric parameter value greater than or equal to the threshold value in the memory 21 at a predetermined time interval. As in the first embodiment, the number of times of writing to the memory 21 can be reduced. Further, the amount of data written in the memory 21 can be reduced. The processing part 14 may store in the memory 21 a value obtained by multiplying the average value of the plurality of electric parameter values when the light emitting part 20 is applied with the power by the total value of the cumulative power-on time. In this way, the amount of data written in the memory 21 can be reduced.

The processing part 14 obtains the data stored in the memory 21 from the memory 21 at any timing. For example, the processing part 14 obtains from the memory 21 the data including the value obtained by multiplying the electric parameter value by the cumulative power-on time at any timing. The processing part 14 may obtain the data stored in the memory 21 from the memory 21 according to a request from the external device 2. For example, the processing part 14 may obtain the data including the value obtained by multiplying the electric parameter value by the cumulative power-on time from the memory 21 according to a request from the external device 2. The user can operate the external device 2 at a desired timing to retrieve the data stored in the memory 21 from the memory 21. The processing part 14 transmits the data obtained from the memory 21 to the external device 2. For example, the processing part 14 transmits the data including the value obtained by multiplying the electric parameter value by the cumulative power-on time to the external device 2. Further, the processing part 14 may transmit the data stored in the main body memory 13 to the external device 2 according to a request from the external device 2.

The external device 2 receives the data stored in the memory 21 from the image sensor 1. For example, the external device 2 receives the data including the value obtained by multiplying the electric parameter value by the cumulative power-on time from the image sensor 1. The processing device of the external device 2 predicts the lifetime of the light emitting part 20 based on the data stored in the memory 21. For example, the processing device of the external device 2 predicts the lifetime of the light emitting part 20 based on the data including the value obtained by multiplying the electric parameter value by the cumulative power-on time. The processing device of the external device 2 may predict the lifetime of the light emitting part 20 based on the data including the value obtained by multiplying the current value by the cumulative power-on time. The processing device of the external device 2 may predict the lifetime of the light emitting part 20 by calculating the lifetime of the light emitting part 20 with use of a known lifetime calculation formula. The processing device of the external device 2 may obtain other data used for predicting the lifetime of the light emitting part 20 from the DB. With the prediction result of the lifetime of the light emitting part 20 displayed on the display device of the external device 2, the user can recognize the lifetime of the light emitting part 20. Based on the prediction result of the lifetime of the light emitting part 20, the user can consider the inspection and replacement time of the illumination part 10. In this way, according to the second embodiment, the illumination part 10 can be monitored.

As in the first embodiment, in the image sensor 1 of the second embodiment, even when the module is reassembled after the start of the power supply to the illumination part 10, the external device 2 can predict the lifetime of the light emitting part 20. Further, the processing device of the external device 2 may determine the state of the light emitting part 20 based on the data stored in the memory 21. For example, the processing device of the external device 2 may determine the state of the light emitting part 20 based on the data including the value obtained by multiplying the electric parameter value by the cumulative power-on time.

Modified Example

The above is an example in which the processing device of the external device 2 predicts the lifetime of the light emitting part 20 based on the data obtained from the memory 21, but the disclosure is not limited to this example. The processing part 14 may predict the lifetime of the light emitting part 20 based on the data obtained from the memory 21. For example, the processing part 14 may predict the lifetime of the light emitting part 20 based on the data including the value obtained by multiplying the electric parameter value by the cumulative power-on time. Further, the processing part 14 may predict the lifetime of the light emitting part 20 based on the data including the value obtained by multiplying the current value by the cumulative power-on time. In this case, the processing part 14 may receive other data used for predicting the lifetime of the light emitting part 20 from the external device 2. The processing part 14 transmits the prediction result of the lifetime the light emitting part 20 to the external device 2. With the prediction result of the lifetime of the light emitting part 20 displayed on the display device of the external device 2, the user can recognize the lifetime of the light emitting part 20. Based on the prediction result of the lifetime of the light emitting part 20, the user can consider the inspection and replacement time of the illumination part 10.

In this way, according to the modified example of the second embodiment, the illumination part 10 can be monitored. Further, the processing part 14 may determine the state of the light emitting part 20 based on the data obtained from the memory 21. For example, the processing part 14 may determine the state of the light emitting part 20 based on the data including the value obtained by multiplying the electric parameter value by the cumulative power-on time.

<Others>

Nevertheless, each of the above embodiments merely exemplifies a configuration example of the disclosure. The disclosure is not limited to the specific form described above, and it is possible to make various modifications within the scope of the technical idea of the disclosure. For example, although each the above embodiments illustrates an example that the three modules are the illumination part, the lens part, and the imaging part, the components to be attached to the image sensor are not limited thereto. For example, an optical filter, the input/output I/F, the processing part (processor and memory), the display, etc. may also be modularized. Regarding the forms in which the smart camera is provided (delivery forms), the modules may be provided separately to be assembled on the user side, or the smart camera may be provided with the illumination module and the lens module incorporated in the sensor body. In the case of the latter form, there is no need to adjust the optical conditions on the user side, so it has the advantage that the image sensor can be introduced more easily.

<Appendix>

[1] An image sensor system, characterized in including an image sensor (1) that has an illumination module (10) having a light emitting part (20) for emitting light and a nonvolatile memory (21) and has a processing part (14) for storing in the memory (21) first data including an electric parameter value when the light emitting part (20) is applied with the power and cumulative power-on time by accumulating time when the light emitting part (20) is applied with the power i or second data including a value obtained by multiplying the electric parameter value when the light emitting part (20) is applied with the power by the cumulative power-on time; and a prediction part (2) for obtaining the first data or the second data from the memory (21) and predicting a lifetime of the light emitting part (20) based on the first data or the second data.

[2] An image sensor (1), characterized in including an illumination module (10) having a light emitting part (20) for emitting light and a nonvolatile memory (21);

a control part (14) for storing in the memory (21) first data including an electric parameter value when the light emitting part (20) is applied with the power and cumulative power-on time by accumulating time when the light emitting part (20) is applied with the power or second data including a value obtained by multiplying the electric parameter value when the light emitting part (20) is applied with the power by the cumulative power-on time; and a prediction part (2) for obtaining the first data or the second data from the memory (21) and predicting a lifetime of the light emitting part (20) based on the first data or the second data.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An image sensor system, comprising:
an image sensor, having an illumination module and a processing part, wherein the illumination module includes a light emitting part for emitting light and a nonvolatile memory; and
wherein the processing part stores a first data or a second data in the nonvolatile memory of the illumination module at a predetermined time interval in order to reduce the number of times of writing into the nonvolatile memory and the amount of data of writing into the nonvolatile memory,
wherein the processing part obtains the first data or the second data from the nonvolatile memory of the illumination module and predicts a lifetime of the light emitting part based on the obtained first data or the obtained second data in response to a request received from an external device,
wherein the light emitting part is operable with a plurality of electric parameter values,
wherein the first data comprises the plurality of electric parameter values when the light emitting part is applied with a power and a cumulative power-on time for each of the plurality of electric parameter values,
wherein the second data comprises values obtained by respectively multiplying the plurality of electric parameter values when the light emitting part is supplied with the power by the cumulative power-on time for each of the plurality of electric parameter values, and
wherein the cumulative power-on time is a time period obtained by accumulating time when the light emitting part is supplied with the power in response to the corresponding electric parameter value,
wherein the processing part obtains the data including the plurality of electric parameter values and a plurality of cumulative power-on time from the nonvolatile memory of the illumination module at any time upon receiving a request from the external device,
wherein the processing part computes a light output of the light emitting part based on the cumulative power-on time which is a part of the first data and deteiniines that the light emitting part has reached the end of the lifetime when the light output of the light emitting part is less than or equal to a reference value,
wherein the light output of the light emitting part is obtained using an Expression 1 and an Expression 2 as follows:

$$P = P_0 \times \exp(-\beta t) \qquad \text{[Expression 1]}$$

wherein β represents the light output, $P_0$ represents an initial light output, β represents a degradation rate, and t represents the cumulative power-on time from the first data;

$$\beta = \beta_0 \times IF \times \exp(-Ea/kTj) \qquad \text{[Expression 2]}$$

wherein $\beta_0$ represents a degradation constant, IF represents a current value that is the electric parameter value in the first data, Ea represents an activation energy [eV], k represents a Boltzmann constant ($8.62 \times 10^{-5}$) [ev/K], and Tj represents a temperature of light emitting layer [K].

2. The image sensor according to claim 1, wherein the plurality of electric parameter values comprises a current value, a voltage value, a forward voltage value and a resistance value.

3. The image sensor system according to claim 1, wherein an Electrically Programmable Read Only Memory (EPROM), an Electrically Erasable Programmable Read Only Memory (EEPROM), a Ferroelectric Random Access Memory (FeRAM), or Magnetoresistive Random-Access Memory (MRAM) is used as the nonvolatile memory of the illumination module.

4. An image sensor system, comprising:
an image sensor, having an illumination module and a processing part, wherein the illumination module includes a light emitting part for emitting light and a nonvolatile memory; and
wherein the processing part stores a first data and a second data in the nonvolatile memory of the illumination module at a predetermined time interval in order to reduce the number of times of writing into the nonvolatile memory and the amount of data of writing into the nonvolatile memory,
wherein the processing part obtains the first data or the second data from the nonvolatile memory of the illumination module and predicts a lifetime of the light emitting part based on the obtained first data or the obtained second data in response to a request received from an external device, wherein the first data comprises a first electric parameter value greater than or equal to the first threshold value and a first cumulative power-on time for the first electric parameter value greater than or equal to the first threshold value, wherein the second data comprises a value obtained by multiplying a second electric parameter value greater than or equal to the second threshold value by a second cumulative power-on time for the second electric parameter value greater than or equal to the second threshold value, and wherein the first cumulative power-on time or the second cumulative power-on time is a time period obtained by accumulating time when the light emitting part is supplied with a power in response to the corresponding first or second electric parameter value, wherein the processing part obtains the data including the first electric parameter value, the second electric parameter value, the first cumulative power-on time, and the second cumulative power-on time from the nonvolatile memory of the illumination module at any time upon receiving a request from the external device, wherein the processing part computes a light output of the light emitting part based on the cumulative power-on time which is a part of the first data and determines that the light emitting part has reached the end of the lifetime when the light output of the light emitting part is less than or equal to a reference value, wherein the light output of the light emitting part is obtained using an Expression 1 and an Expression 2 as follows:

$$P=P_0 \times \exp(-\beta t) \quad \text{[Expression 1]}$$

wherein P represents the light output, $P_0$ represents an initial light output, $\beta$ represents a degradation rate, and t represents the cumulative power-on time from the first data;

$$\beta=\beta_0 \times IF \times \exp(-Ea/kTj) \quad \text{[Expression 2]}$$

wherein $\beta_0$ represents a degradation constant, IF represents a current value that is the electric parameter value in the first data, Ea represents an activation energy [eV], k represents a Boltzmann constant ($8.62 \times 10^{-5}$) [ev/K], and Tj represents a temperature of light emitting layer [K].

5. The image sensor according to claim 4, wherein the first electric parameter value and the second electric parameter value comprise a current value, a voltage value, a forward voltage value and a resistance value.

6. The image sensor system according to claim 4, wherein an Electrically Programmable Read Only Memory (EPROM), an Electrically Erasable Programmable Read Only Memory (EEPROM), a Ferroelectric Random Access Memory (FeRAM), or Magnetoresistive Random-Access Memory (MRAM) is used as the nonvolatile memory of the illumination module.

7. An image sensor, comprising:
an illumination module, having a light emitting part for emitting light and a nonvolatile memory;

a control part, storing a first data and a second data in the nonvolatile memory of the illumination module at a predetermined time interval in order to reduce the number of times of writing into the nonvolatile memory and the amount of data of writing into the nonvolatile memory, wherein the first data comprises an electric parameter value when the light emitting part is supplied with a power and a cumulative power-on time obtained by accumulating a time when the light emitting part is supplied with the power, wherein the second data comprises a value obtained by multiplying the electric parameter value when the light emitting part is supplied with the power by the cumulative power-on time; and wherein the control part obtains the first data or the second data from the nonvolatile memory of the illumination module and predicts a lifetime of the light emitting part based on the obtained first data or the obtained second data in response to a request received from an external device, wherein the control part obtains the data including the electric parameter value and the cumulative power-on time from the nonvolatile memory of the illumination module at any time upon receiving a request from the external device, wherein the control part computes a light output of the light emitting part based on the cumulative power-on time which is a part of the first data and determines that the light emitting part has reached the end of the lifetime when the light output of the light emitting part is less than or equal to a reference value, wherein the light output of the light emitting part is obtained using an Expression 1 and an Expression 2 as follows:

$$P=P_0 \times \exp(-\beta t) \quad \text{[Expression 1]}$$

wherein P represents the light output, $P_0$ represents an initial light output, $\beta$ represents a degradation rate, and t represents the cumulative power-on time from the first data;

$$\beta=\beta_0 \times IF \times \exp(-Ea/kTj) \quad \text{[Expression 2]}$$

wherein $\beta_0$ represents a degradation constant, IF represents a current value that is the electric parameter value in the first data, Ea represents an activation energy [eV], k represents a Boltzmann constant ($8.62 \times 10^{-5}$) [ev/K], and Tj represents a temperature of light emitting layer [K].

8. The image sensor according to claim 7, wherein a plurality of electric parameter value comprises a current value, a voltage value, a forward voltage value and a resistance value.

9. The image sensor according to claim 7, wherein an Electrically Programmable Read Only Memory (EPROM), an Electrically Erasable Programmable Read Only Memory (EEPROM), a Ferroelectric Random Access Memory (FeRAM), or Magnetoresistive Random-Access Memory (MRAM) is used as the nonvolatile memory of the illumination module.

* * * * *